United States Patent [19]
Kohno

[11] Patent Number: 5,363,060
[45] Date of Patent: Nov. 8, 1994

[54] MICROWAVE AMPLIFIER

[75] Inventor: Masaki Kohno, Itami, Japan

[73] Assignee: Mitsubishi Denki Kabushiki Kaisha, Tokyo, Japan

[21] Appl. No.: 103,531

[22] Filed: Aug. 9, 1993

[30] Foreign Application Priority Data

Aug. 12, 1992 [JP] Japan .................. 4-237703

[51] Int. Cl.$^5$ .............................................. H03F 3/60
[52] U.S. Cl. ..................................... 330/286; 330/307
[58] Field of Search ................ 330/53, 54, 66, 277, 330/286, 302, 303, 306, 307

[56] References Cited

U.S. PATENT DOCUMENTS 5,065,117  11/1991  Yoshimasu ............... 330/286 X
5,270,668  12/1993  Ikeda et al. ................. 330/286

FOREIGN PATENT DOCUMENTS 276401   3/1990  Japan .
366211   3/1991  Japan .
457502   2/1992  Japan .
4068706  3/1992  Japan .................. 330/286

Primary Examiner—Steven Mottola
Attorney, Agent, or Firm—Leydig, Voit & Mayer

[57] ABSTRACT

A microwave amplifier includes an amplifier, an impedance matching circuit for matching input and output impedances of the amplifier, and an open stub. The impedance matching circuit includes input and output side distributed constant lines each having a length equivalent to a ¼ wavelength of a signal having the highest frequency in a desired frequency band. The open stub is disposed in the vicinity of the input or output side distributed constant line. The length of the open stub is varied to vary a narrow frequency band in which the maximum gain of the amplifier is attained. In this structure, the return loss is reduced and a uniform tuning in the frequency band is easily carried out using the open stub. In addition, the maximum potential of the amplifier is achieved in the desired frequency band.

8 Claims, 12 Drawing Sheets

Prior Art

MICROWAVE AMPLIFIER

FIELD OF THE INVENTION

The present invention relates to an internally matched GaAs field effect transistor (hereinafter referred to as FET) operating at microwave frequencies.

Figures 9A, 9B:
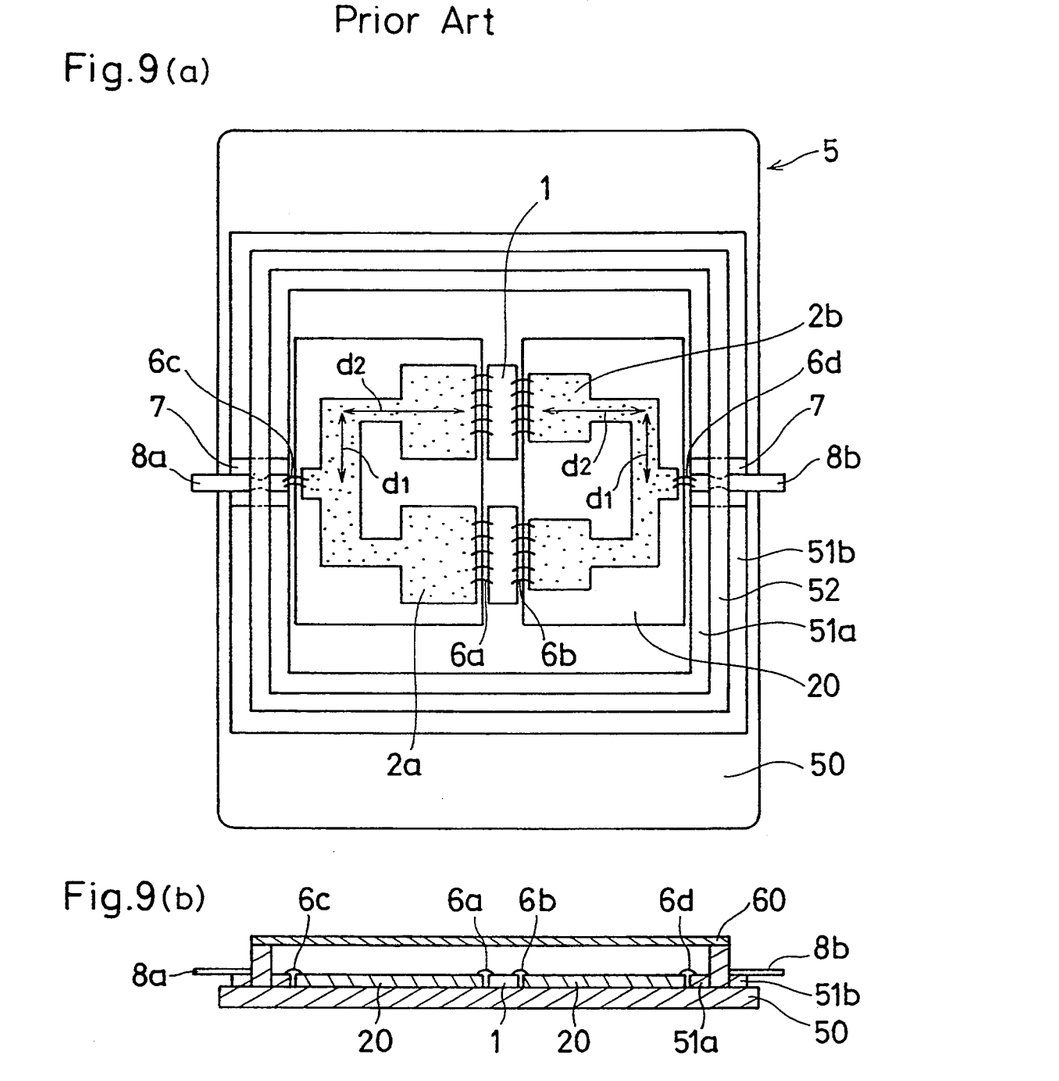
FIGS. 9(a) and 9(b) are a plan view and a sectional view, respectively, illustrating a microwave amplifier mounted on a package in accordance with the prior art.
Figure 10:
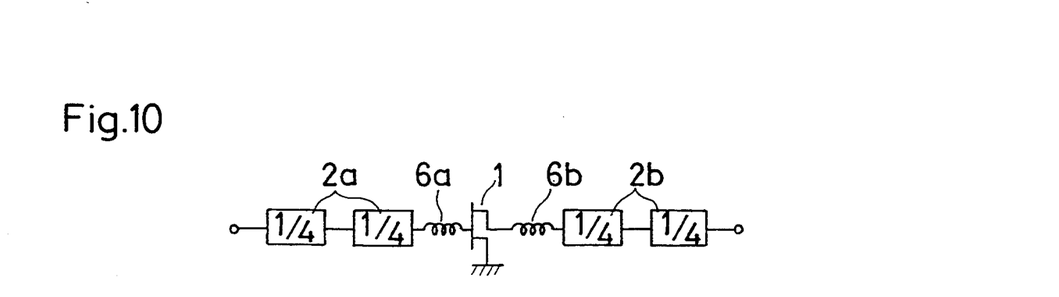
FIG. 10 is an equivalent circuit diagram of the microwave amplifier shown in FIG. 9(a)

FIGS. 9(a) and 9(b) are a plan view and a sectional view illustrating a conventional microwave amplifier package including internal matching of GaAs FETs. FIG. 10 is an equivalent circuit diagram of the microwave amplifier. In the figures, reference numeral 5 designates a package body comprising copper plated with gold. Two GaAs FETs 1 are disposed in the middle of the bottom surface 50 of the package body 5. Dielectric layers 20 comprising a ceramic, such as barium titanate, are disposed on the bottom surface 50 at opposite sides of the GaAs FETs 1. The thickness of the dielectric layer 20 is approximately equal to the thickness of the GaAs FET 1. An input side ¼ wavelength distributed constant line 2a and an output side ¼ wavelength distributed constant line 2b are disposed on the dielectric layers 20. Each of the ¼ wavelength distributed constant lines 2a and 2b has a length equivalent to ¼ wavelength of a signal having the highest frequency in a desired frequency band. The input side ¼ wavelength distributed constant line 2a is connected to the gates of the GaAs FETs 1 via wires 6a, and the output side ¼ wavelength distributed constant line 2b is connected to the drains of the GaAs FETs 1 via wires 6b.

The dielectric layers 20 are surrounded by an internal step 51a, a side wall 52, and an external step 51, which are disposed on the bottom surface 50 of the package body 5. An insulator 7, such as ceramic, penetrates through portions of the step 51a, the side wall 52, and the step 51. An input side external lead (input terminal) 8a and an output side external lead (output terminal) 8b are disposed on the insulators 7, whereby the input and output side external leads 8a and 8b are insulated from the package body 5. These input side and output side external leads 8a and 8b are connected to the input side and output side ¼ wavelength distributed constant lines 2a and 2b, respectively. A lid 60 comprising copper plated with gold is disposed on the side wall 52. In the sectional view of FIG. 9(b), the insulators 7 are not shown.

In the above-described structure, both of the input impedance and the output impedance of the GaAs FET 1 are lower than 50Ω, and the impedances are matched at 50Ω in the internal matching circuit utilizing the ¼ wavelength distributed constant lines 2a and 2b. Generally, in the high frequency and high power FET, the input impedance is lower than the output impedance and, therefore, the input side ¼ wavelength distributed constant line 2a is larger than the output side ¼ wavelength distributed constant line 2b. In addition, each of the distributed constant lines 2a and 2b comprises two stages of ¼ wavelength distributed constant lines respectively having dimensions d1 and d2, realizing a broad-band operable amplifier. Accordingly, as shown in FIG. 10, the input and output side internal matching circuits 2a and 2b each comprising the two-stage ¼ wavelength distributed constant lines are disposed on opposite sides of the GaAs FETs 1, and the internal matching circuits 2a and 2b and the FETs 1 are contained in the package 5.

A description is given of the operation.

Figure 11:
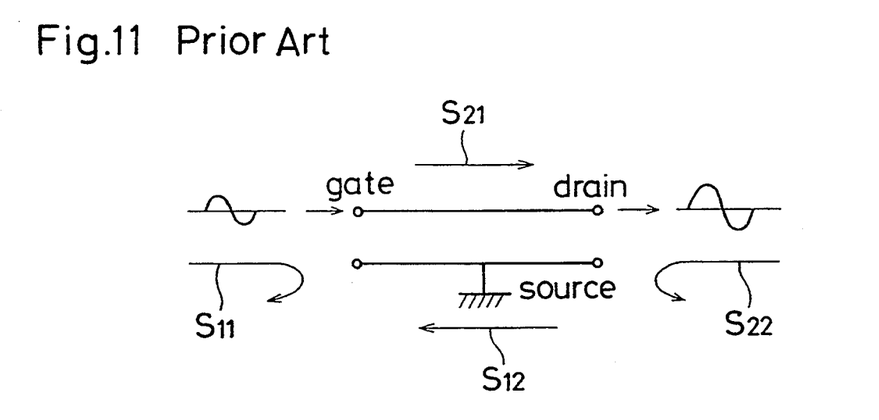
FIG. 11 is a schematic diagram for explaining kinds of small signal S parameters of an FET used for making a microwave amplifier.
Figure 12:
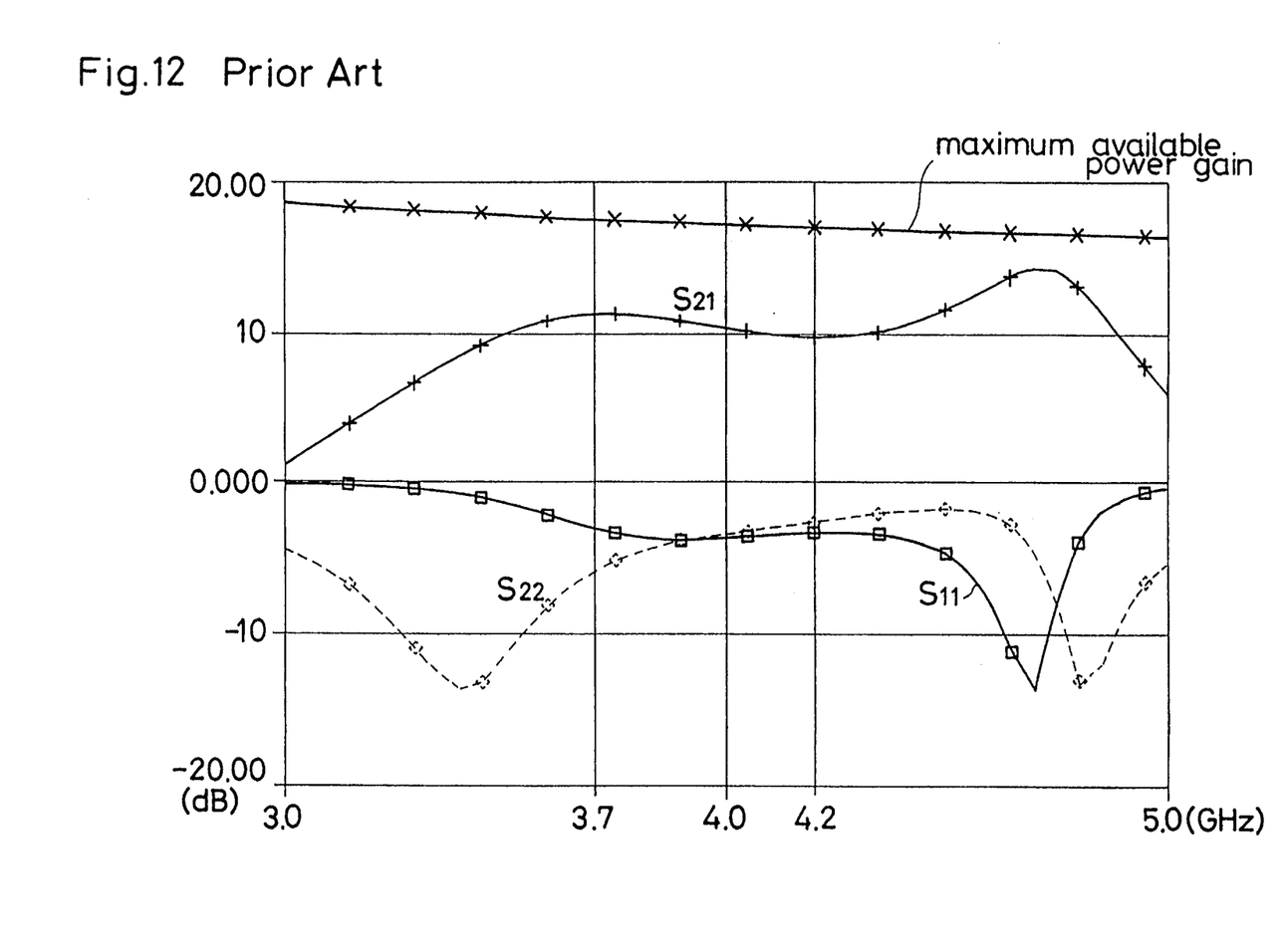
FIG. 12 is a graph illustrating simulation results of the microwave amplifier in accordance with the prior art.
Figure 13:
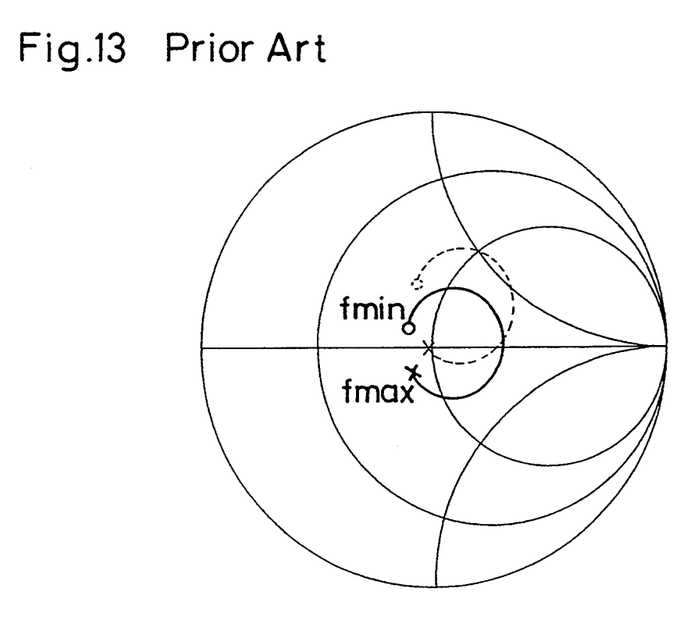
FIG. 13 is a Smith chart illustrating characteristics of a small signal S parameter of the microwave amplifier in accordance with the prior art.

FIG. 11 is a schematic diagram illustrating parameters relating to a small signal S in the FET, in which S11 and S22 are input and output reflections, respectively, and S21 and S12 are power gains. FIG. 12 is a graph illustrating simulation results of the conventional internal matching GaAs FET. FIG. 13 is a Smith chart illustrating the output reflection wave S22.

First of all, the output reflection S22 will be described. In case of the impedance matching circuit comprising the two-stage distributed constant lines, the frequency band is considerably broad and, therefore, the small signal S22 representation is a circle on the Smith chart in a desired frequency band, i.e., 3.7 to 4.2 GHz, as indicated by the solid line of FIG. 13. There is no problem when the small signal S22 representation is a circle around the point of 50Ω at a relatively short distance from the point of 50Ω. However, when the circle is a relatively long distance from the point of 50Ω as shown by the broken line, the impedance or the electric length of the internal matching circuit is different from the design value and causes a return loss which makes it difficult to uniformly tune the impedance in the frequency band by simply adjusting an open stub.

Next, the power gain S21 will be described. Since the frequency band is broad as shown in FIG. 12, the path through which the microwave signal is transmitted is long, increasing the transmission loss. In frequency band where the output reflection S22 is large, the power gain |S21| is considerably lower than the maximum available power gain of the FET.

In the conventional microwave amplifier, since the broad-band operation is achieved by the two-stage ¼ wavelength distributed constant lines, it is difficult to bring out the potentialities, such as gain, output power, and efficiency, of the FET chip at each of desired frequencies (narrow frequency bands) in the frequency range at which the FET operates normally.

In addition, if the impedance or the electrical length of the internal matching circuit is different from the design value, tuning in the frequency band by only adjusting an open stub or the like is difficult.

Meanwhile, in Japanese published patent applications Nos. Hei. 3-66211, 4-57502, and 2-76401, when input and output impedances of a main line comprising a microstrip line are matched to input and output impedances of a transistor, an open stub or a shorted stub is employed and the length of the stub is varied to adjust the effective length of the microstrip line. However, the matching circuits disclosed in these prior art publications are lumped parameter circuits only for matching the input and output impedances between the main line and the transistor and, therefore, these prior art circuits cannot achieve the full potential of the FET at desired narrow frequency bands in the frequency range at which the FET operates normally.

SUMMARY OF THE INVENTION

It is an object of the present invention to provide a microwave amplifier that achieves the potential of an FET chip at each of desired narrow frequency bands, that easily varies the available frequency band, and that covers a frequency band as broad as or broader than the frequency band of the conventional device.

It is another object of the present invention to provide a microwave amplifier that provides uniform tuning in a frequency band when the impedance or the electrical length of the internal matching circuit is different from the design value, by a simple adjustment of an open stub or the like.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a microwave amplifier includes an impedance matching circuit comprising input and output side distributed constant lines each having a length equivalent to a ¼ wavelength of a signal having the highest frequency in a desired frequency band, and an open stub disposed in the vicinity of the input or output side distributed constant line. The length of the open stub is varied to vary a narrow frequency band in which the maximum gain of the amplifier is attained. In this structure, the return loss is reduced and uniform tuning in the frequency band is easily carried out using the open stub. In addition, the maximum potential of the amplifier can be brought out in the desired frequency band.

According to a second aspect of the present invention, the open stub comprises a plurality of island patterns which are connected to each other by fine patterns. The fine patterns connecting the island patterns are selectively severed, i.e., opened, by applying current, whereby the length of the open stub is easily varied.

According to a third aspect of the present invention, the open stub comprises a plurality of island patterns with different lengths, and one of the island patterns is selected by a switch, such as a rotatable bar with a conductive material at the tip thereof, and is connected to a main line, whereby the length of the open stub is easily varied.

According to a fourth aspect of the present invention, the open stub comprises a plurality of island patterns spaced apart from each other, and adjacent island patterns are selectively connected to each other by a conductive switch, such as a bar with a conductive material at the tip thereof, which is applied to the island patterns from above, whereby the length of the open stub is easily varied. In addition, a longer open stub is attained in a narrower area.

According to a fifth aspect of the present invention, the open stub comprises a metal of a prescribed size disposed through a projection on the rear surface of a lid of a package, and the metal is connected to a main line when the package is closed with the lid. In this case, the length of the open stub is varied according to the size of the metal. In addition, the package sealing process and the stub length adjusting process are carried out at the same time.

DETAILED DESCRIPTION OF THE PREFERRED EMBODIMENTS

Figure 1:
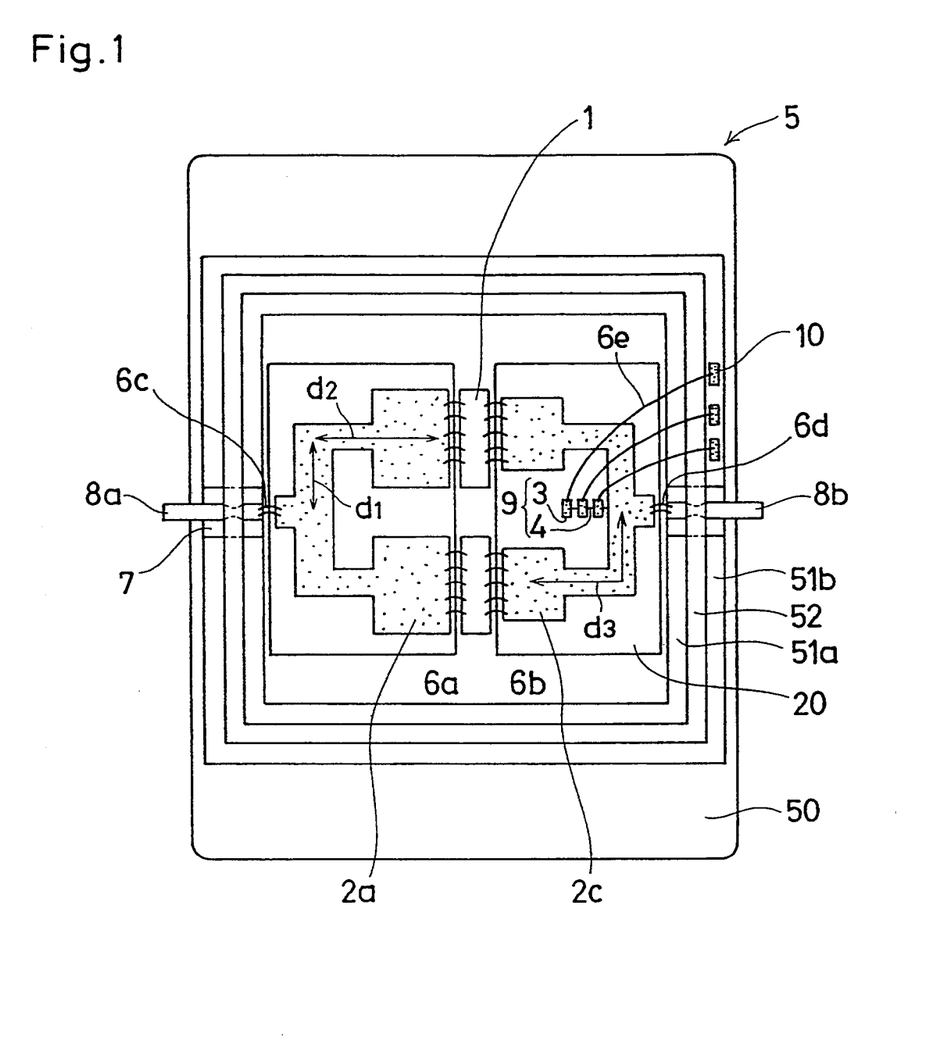
FIG. 1 is a plan view illustrating a microwave amplifier mounted on a package in accordance with a first embodiment of the present invention.
Figure 2:
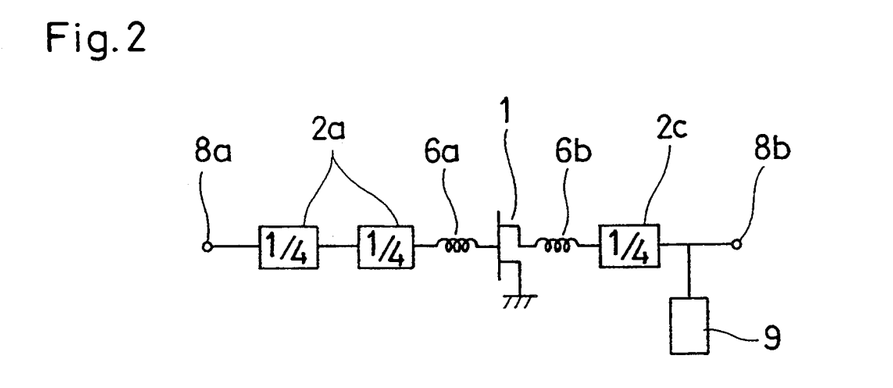
FIG. 2 is an equivalent circuit diagram of the microwave amplifier shown in FIG. 1.

FIG. 1 is a plan view illustrating a microwave amplifier mounted on a package in accordance with a first embodiment of the present invention. FIG. 2 is an equivalent circuit diagram of the microwave amplifier of FIG. 1. In the figures, the same reference numerals as those in FIG. 9(a) and FIG. 10 designate the same or corresponding parts. Reference numeral 2c designates a ¼ wavelength distributed constant line having a length equivalent to ¼ wavelength of a signal having the highest frequency in a desired frequency band. This ¼ wavelength distributed constant line 2c forms an output side matching circuit. The ¼ wavelength distributed constant line 2c is smaller than the conventional ¼ distributed constant line 2b shown in FIG. 9(a) and includes a single-stage ¼ wavelength distributed constant line having a dimension of d3. A plurality of conductive island patterns 3 are disposed on the surface of the insulating layer 20 and connected to each other or to the output side ¼ wavelength distributed constant line 2c by fine patterns 4. The island patterns 3 and the fine patterns 4 form an open stub 9 shown in FIG. 2.

Reference numeral 10 designates current supply pads disposed on the external step 51b of the package body 5. The current supply pads 10 are connected to the respective island patterns 3 by wires 6e which are thicker than the fine patterns 4.

In the equivalent circuit diagram of FIG. 2, the output side matching circuit comprises the single-stage ¼ wavelength distributed constant line 2c and the open stub 9 disposed in the vicinity of and connected to the output terminal 8b.

A description is given of a method for attaining impedance matching in a desired frequency band using the above-described microwave amplifier.

In order to achieve impedance matching in a desired frequency band, the length of the open stub 9 is adjusted. More specifically, a power supply is connected to the current supply pads 10 corresponding to the island patterns 3 to be cut off to adjust the length of the open stub 9, and a heavy current, for example, $5 \times 10^5$ A/cm$^2$, is applied to the fine patterns 4 to burn off the fine patterns 4 connecting the island patterns to be cut off. In this way, the open stub 9 with a desired length is easily attained.

Figure 3:
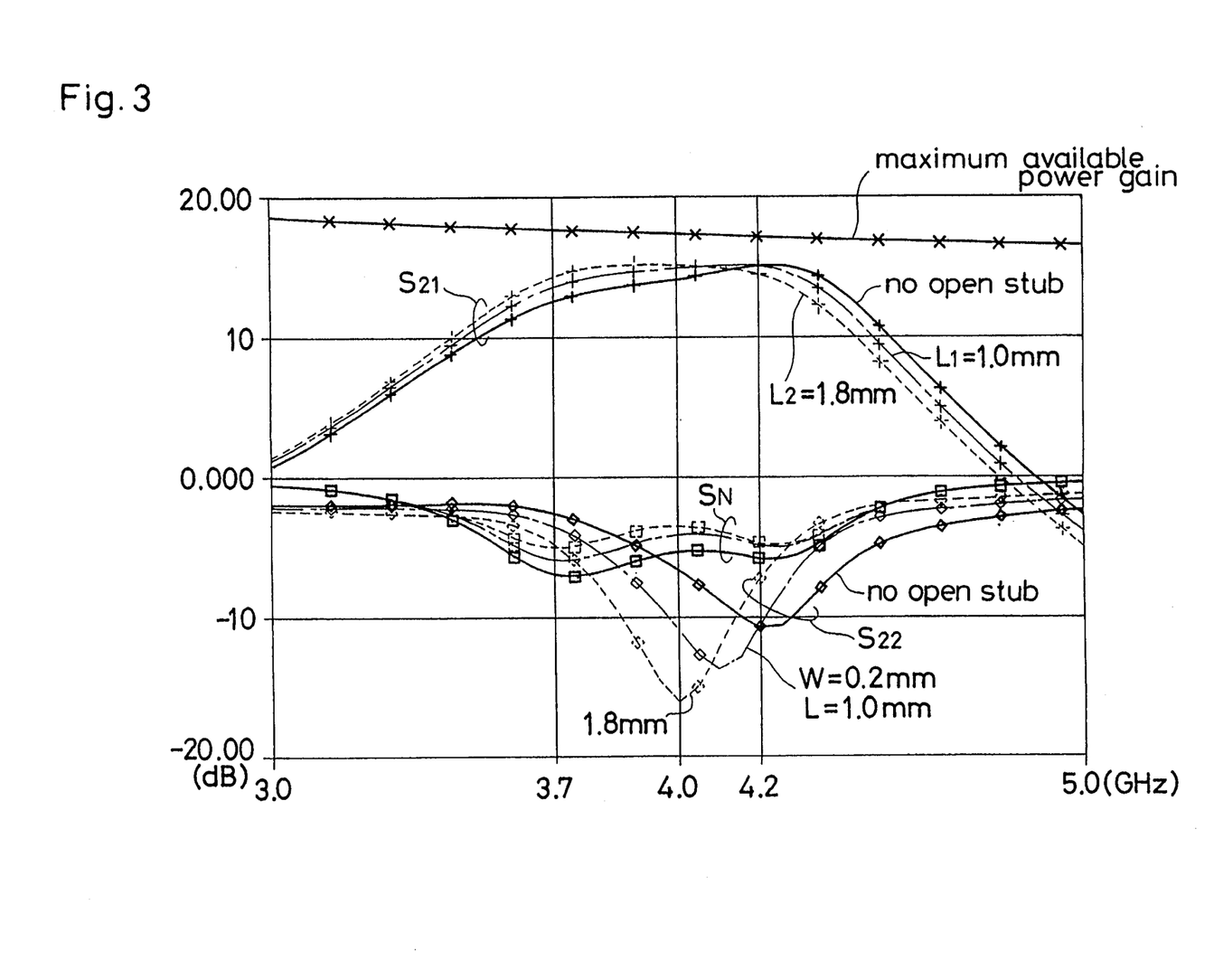
FIG. 3 is a graph illustrating simulation results at various lengths of an open stub included in the microwave amplifier in accordance with the first embodiment of the present invention.
Figure 4:
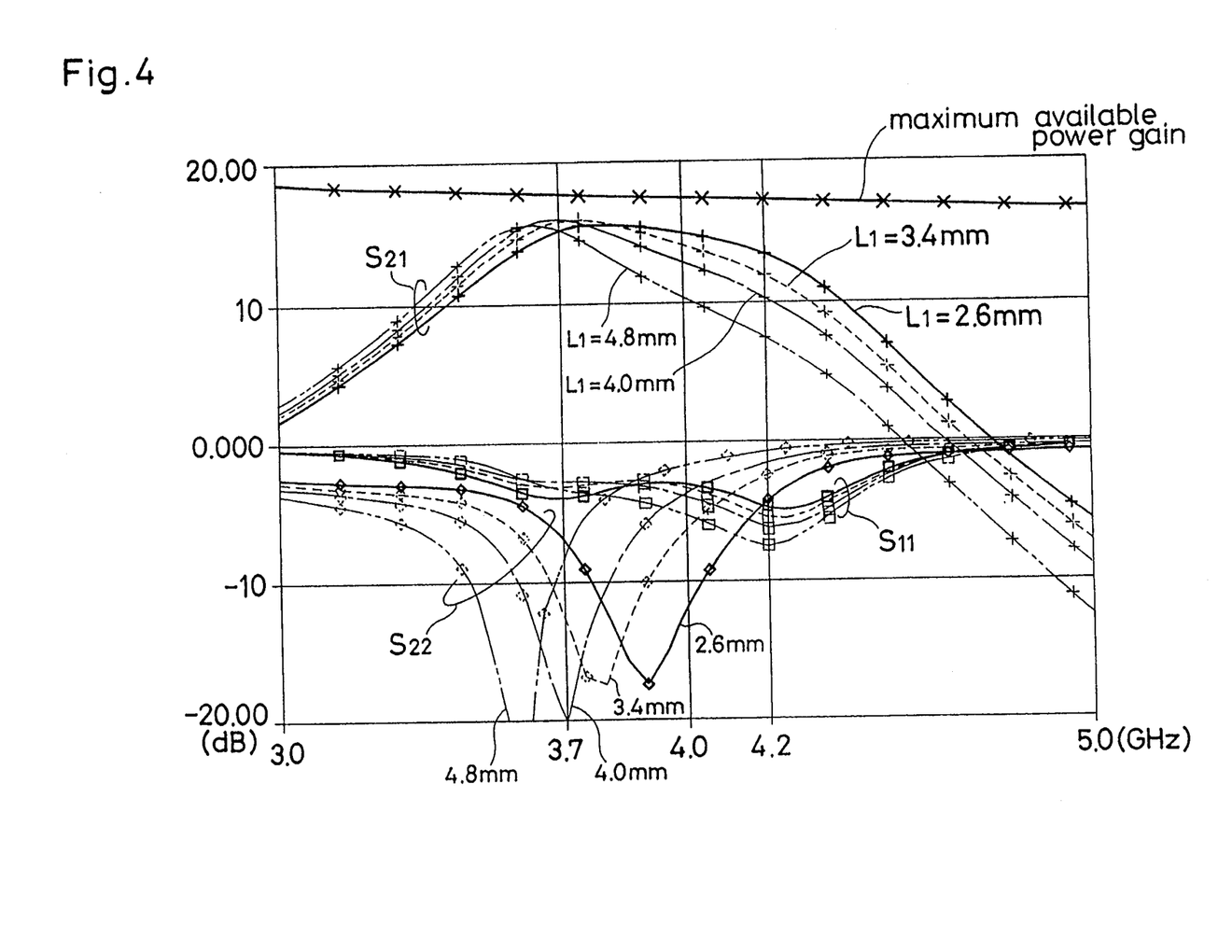
FIG. 4 is a graph illustrating simulation results at various lengths of an open stub included in the microwave amplifier in accordance with the first embodiment of the present invention.
Figure 5:
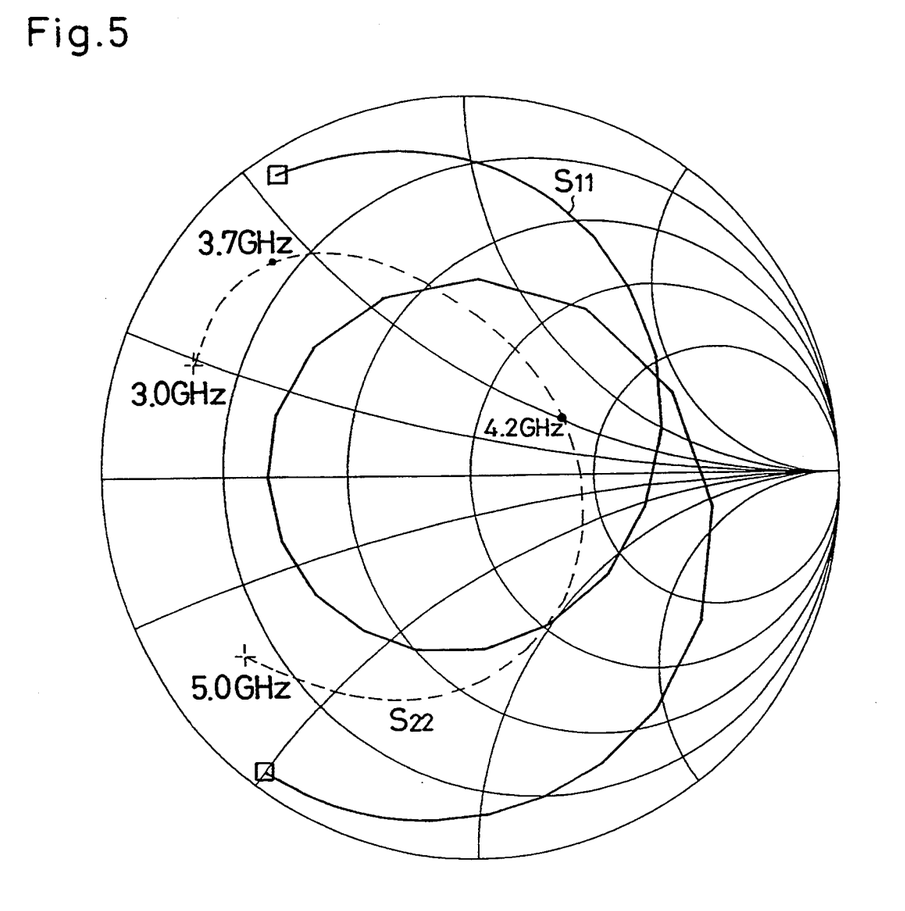
FIG. 5 is a Smith chart illustrating characteristics of small signal S parameters due to a single-stage distributed constant line of the microwave amplifier in accordance with the first embodiment of the present invention.

FIGS. 3 and 4 are graphs illustrating simulation results of the microwave amplifier of FIG. 1, in which frequency characteristics of the small signal parameters |S21|, |S11|, and |S22| are shown. The simulation is carried out with a structure including an alumina substrate while varying the length of the open stub 9 in a range from 0 mm to 4.8 mm. FIG. 5 is a Smith chart illustrating the input reflection S11 and the output reflection S22 in case where the open stub 9 is absent in the structure of FIG. 1.

This microwave amplifier achieves impedance matching with the single-stage ¼ wavelength distributed constant line 2c. To be specific, the FET 1 includes four GaAs FET chips each having a gate width of 12.6 mm, i.e., the total gate width of the FET 1 is 50.4 (=12.6×4) mm. The desired frequency band ranges from 3.7 GHz to 4.2 GHz. First of all, impedance matching is performed at the highest frequency ($f_{max}$=4.2 GHz) in the frequency band with the single-stage ¼ wavelength distributed constant line 2c. As shown in FIG. 5, when the impedance matching is carried out by the single-stage distributed constant line 2c, the output reflection S22 moves on the Smith chart in the frequency band ranging from 3.7 to 4.2 GHz along a path that is not a circle. The impedance is matched to 50Ω at the frequency of about 4.2 GHz as shown by the broken line in FIG. 5.

In this state, if the open stub 9 is disposed in the vicinity of the output terminal 8b, a shunt capacitance is generated that increases with an increase in the length of the open stub 9, whereby the frequency at which the impedance matching is achieved is lowered. More specifically, as illustrated in FIG. 3, when the open stub is absent, the output reflection S22 is minimum at 4.2 GHz, so that the power gain S21 has a peak in the vicinity of 4.2 GHz. On the other hand, when using the open stub 9 having a length $L_2$ of 1.8 mm, the impedance match is made at the frequency of about 4.0 GHz, so that the output reflection S22 is minimum and the power gain S21 is maximum in the vicinity of 4.2 GHz. As illustrated in FIG. 4, as the length of the open stub 9 increases, the frequency at which the impedance match is made is lowered, the output reflection S22 decreases, and the reduction in the power gain S21 before and after the peak increases.

According to the first embodiment of the present invention, the impedance matching is performed by the single-stage ¼ wavelength distributed constant line 2c having a length equivalent to ¼ wavelength of a signal having the highest frequency in a desired frequency band, and the length of the open stub 9 disposed in the vicinity of the output terminal is varied to shift the frequency at which an impedance match is achieved toward the lower frequency side. Therefore, the impedance matching is achieved at the desired frequency, and the power gain |S21| of the FET 1 is increased because the length of the signal transmission circuit is reduced. In addition, since the frequency at which the impedance match is achieved is varied by varying the length of the open stub 9, resulting in a microwave amplifier that is usable in a broader frequency band than the conventional microwave amplifier.

Figure 6A:
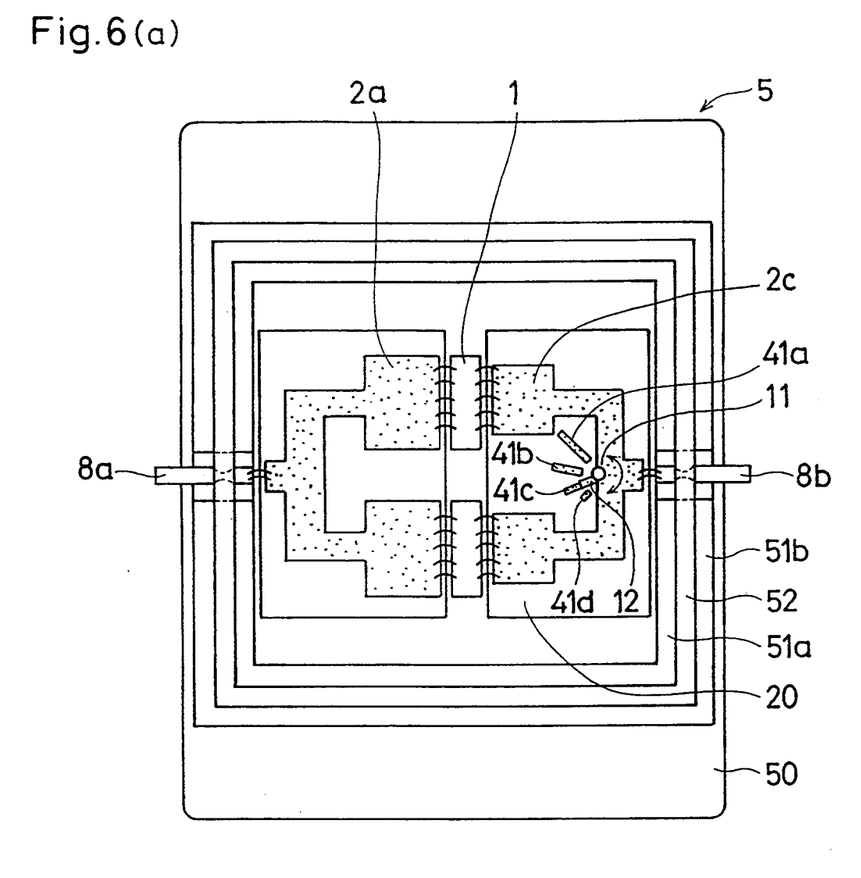
FIGS. 6(a) and 6(b) are a plan view and a sectional view, respectively, illustrating a microwave amplifier mounted on a package in accordance with a second embodiment of the present invention.
Figure 6B:
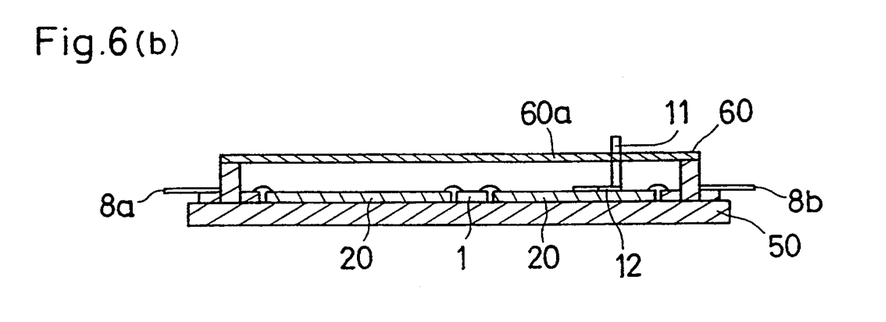

FIGS. 6(a) and 6(b) are a plan view and a sectional view illustrating a microwave amplifier in accordance with a second embodiment of the present invention. In this second embodiment, a plurality of island patterns having different lengths from each other are disposed on the output side insulator 20, and one of the island patterns is selected and connected to the output side ¼ wavelength distributed constant line 2c using a conductive metal with a rotatable mechanism, whereby the length of the open stub is varied.

In FIGS. 6(a) and 6(b), island patterns 41a to 41d having different lengths from each other are radially disposed on the output side insulator 20 and separated from the output side ¼ wavelength distributed constant line 2c. A conductive metal 12 is fixed to a tip of an adjusting rod 11 comprising insulating material. An end of the conductive metal 12 is always in contact with the output side ¼ wavelength distributed constant line 2c while the opposite end thereof is not fixed so that it can be connected to one of the island patterns 41a to 41d by rotating the adjusting rod 11 as shown by the arrow. As shown in FIG. 6(b), an upper end of the adjusting rod 11 protrudes from the surface of the lid 60 through an aperture 60a in the lid 60 and passes.

A description is given of the impedance adjusting method for achieving an impedance match in a desired frequency band using the microwave amplifier of figures 6(a)–6(b). Also in this second embodiment, the impedance matching is performed by the single-stage ¼ wavelength distributed constant line 2c having a length equivalent to ¼ wavelength of the highest frequency in a desired frequency band. In addition, a desired island pattern is selected and connected to the main line 2c using the rotatable adjusting rod 7, whereby the impedance matching is achieved in a desired frequency band. If the frequency at which the impedance match is achieved is to be the highest frequency in the frequency band, the adjusting rod 11 is turned toward the longest island pattern 41a and the conductive metal 12 is connected to a desired island pattern. On the other hand, if the frequency at which the impedance match is achieved is to be the lowest frequency in the frequency band, the adjusting rod 11 is turned toward the shortest island pattern 41d and the conductive metal 12 is connected to a desired island pattern.

According to the second embodiment of the present invention, the impedance match is easily performed from outside of the package. Therefore, the impedance match once attained at the higher frequency side can be changed to an impedance match at the lower impedance side.

Figure 7A:
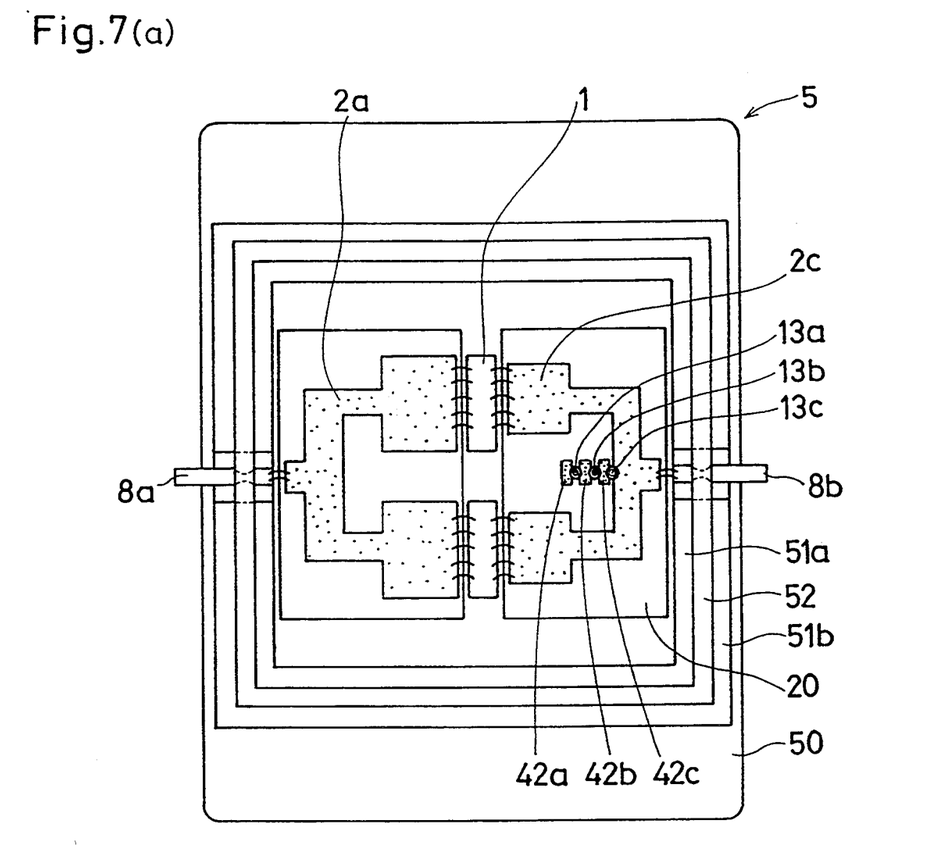
FIGS. 7(a) and 7(b) are a plan view and a sectional view, respectively, illustrating a microwave amplifier mounted on a package in accordance with a third embodiment of the present invention.
Figure 7B:
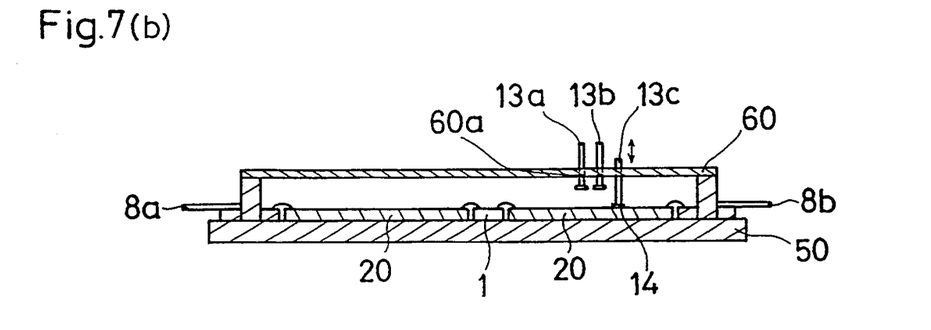

FIGS. 7(a) and 7(b) are a plan view and a sectional view illustrating a microwave amplifier in accordance with a third embodiment of the present invention. In this third embodiment, a plurality of island patterns are disposed on the insulator spaced apart from each other, and the connections between these island patterns are controlled from the outside of the package to vary the length of the open stub.

In FIGS. 7(a) and 7(b), reference numeral 13 designates pressure bars comprising an insulating material. A conductive metal 14 is attached to an end of each pressure bar 13. The opposite end of the pressure bar 13 protrudes from the surface of the lid 60 through an aperture 60a of the lid 60. The aperture 60a is positioned so that the conductive metal 14 connects two adjacent island patterns 42 when the pressure bar 13 is pushed downward.

A description is given of the impedance adjusting method for attaining an impedance match in a desired frequency band using the microwave amplifier of figures 7(a)–7(b). Also in this third embodiment, the impedance match is performed by the single-stage ¼ wavelength distributed constant line 2c having a length equivalent to ¼ wavelength of the highest frequency in a desired frequency band. In addition, as shown in FIG. 7(b), the island patterns 42a to 42c and the main line 2c are electrically connected by selectively pushing down the pressure bars 13, whereby impedance matching is achieved in a desired frequency band. If the frequency at which an impedance match is achieved is to be the highest frequency in the frequency band, the island pattern 42c is connected to the main line 2c by pushing down the pressure bar 13c, and the pressure bars 13b and 13a are successively pushed down to connect the adjacent island patterns 42c and 42b and the adjacent island patterns 42b and 42a, respectively, whereby the effective length of an open stub is increased. On the other hand, if the frequency at which the impedance match is achieved is to be the lowest frequency in the frequency band, the pressure bars 13a, 13b, and 13c are successively pulled up in this order, whereby the effective length of the open stub is reduced.

According to the third embodiment of the present invention, impedance match is easily performed from outside of the package. Therefore, an impedance match once attained at the higher frequency side can be changed to an impedance match at the lower impedance side. In addition, since the island patterns 42a to 42c of this third embodiment occupy less area than the island patterns 41a to 41d of the second embodiment having different lengths from each other, more island patterns can be disposed on the insulating substrate, covering a wider frequency band.

Figure 8A:
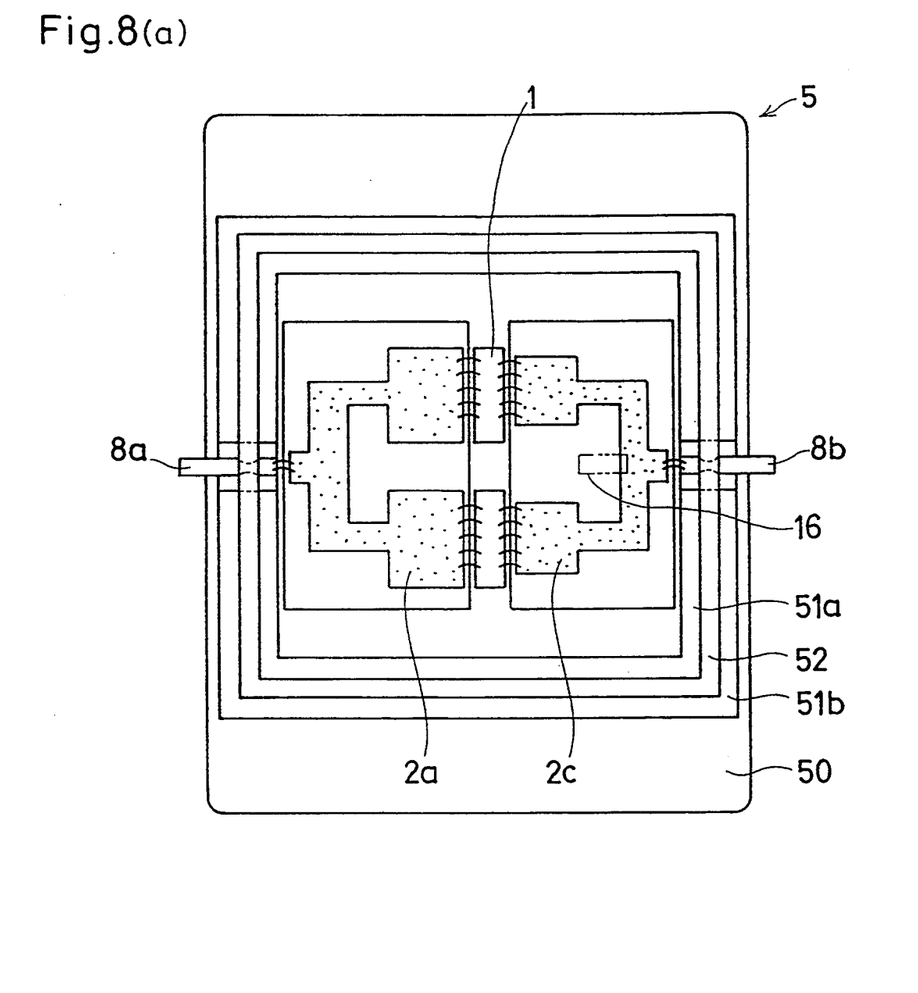
FIGS. 8(a) and 8(b) are a plan view and a sectional view, respectively, illustrating a microwave amplifier mounted on a package in accordance with a fourth embodiment of the present invention.
Figure 8B:
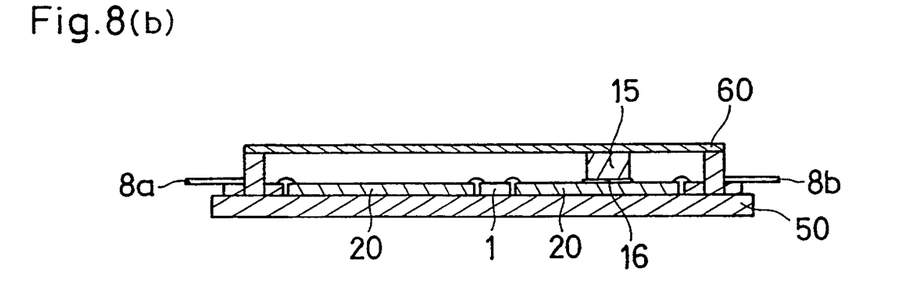

FIGS. 8(a) and 8(b) are a plan view and a sectional view illustrating a microwave amplifier in accordance with a fourth embodiment of the present invention. In this fourth embodiment, an insulating projection 15 is disposed on the rear surface of the lid 60 and a conductive metal sheet 16 of a prescribed size is attached to the side of the projection 15 opposite the lid 60. The height of the projection 15 is determined so that the conductive metal 16 is electrically connected to the output side ¼ wavelength distributed constant line 2c when the package 50 is covered with the lid 60.

A description is given of the impedance adjusting method for attaining an impedance match in a desired frequency band using the microwave amplifier of figures 8(a)–8(b). Also in this third embodiment, the impedance match is performed by the single-stage ¼ wavelength distributed constant line 2c having a length equivalent to ¼ wavelength of the highest frequency in a desired frequency band. As shown in FIG. 8(b), when the package body 50 is covered with the lid 60 having the conductive metal sheet 16 disposed on the insulating projection 15 on the rear surface of the lid 60, the conductive metal 16 is electrically connected to the output side ¼ wavelength distributed constant line 2c, providing a stub having a length in accordance with the size of the metal sheet 16. If a plurality of lids with the conductive metal sheet of different sizes are prepared and a lid which provides an impedance match at a desired frequency is selected and attached to the package, the same effects as in the first embodiment of the present invention are attained. In addition, the package sealing process and the frequency band adjusting process are performed at the same time.

While in the above-described first to fourth embodiments an open stub is connected to the output side match circuit, it may also be connected to an input side match circuit or open stubs may be connected to both of the input and output side matching circuits.

While in the above-described first to fourth embodiments two FETs are employed as the amplifier, the number of FETs is not restricted thereto.

While in the above-described third embodiment the island patterns 42a to 42c are arranged in a straight line, these island patterns may be arranged in a curved line or in zig-zags. In this case, more island patterns can be disposed on the insulating substrate, increasing the length of the open stub.

What is claimed is:

1. A microwave amplifier comprising:
   an amplifier;
   an impedance match circuit for match input and output impedances of said amplifier, said impedance match circuit comprising input and output side distributed constant lines, each line having a length equivalent to ¼ wavelength of a signal having the highest frequency in a desired frequency band;
   an open stub connected to at least one of said input and output side distributed constant lines, the length of said open stub being variable for varying a narrow frequency band in which maximum gain of said amplifier is attained; and
   a package containing said amplifier and said impedance matching circuit, said open stub comprising a plurality of electrically conducting islands connected to each other by narrow electrically conducting patterns and connected to respective power supply pads disposed outside said package, said narrow patterns connecting the islands being selectively severable with an electrical current selectively applied to said power supply pads to produce a desired length of said open stub.

2. A microwave amplifier comprising:
   an amplifier;
   an impedance matching circuit for matching put and output impedances of said amplifier, said impedance match circuit comprising input and output side distributed constant lines, each line having a length equivalent to ¼ wavelength of a signal having the highest frequency in a desired frequency band;
   an open stub connected to at least one of said input and output side distributed constant lines, the length of said open stub being variable for varying a narrow frequency band in which maximum gain of said amplifier is attained;
   a package containing said amplifier and said impedance match circuit, said open stub comprising a plurality of electrically conducting islands with respective, different lengths spaced apart from each other; and a switch for selecting one of the islands and connecting the selected island to one of said distributed constant lines, thereby providing a desired length of said open stub.

3. A microwave amplifier comprising:

an amplifier;

an impedance match circuit for matching input and output impedances of said amplifier, said impedance matching circuit comprising input and output side distributed constant lines, each line having a length equivalent to ¼ wavelength of a signal having the highest frequency in a desired frequency band;

an open stub connected to at least one of said input and output side distributed constant lines, the length of said open stub being variable for varying a narrow frequency band in which maximum gain of said amplifier is attained;

a package containing said amplifier and said impedance match circuit, said open stub comprising a plurality of electrically conducting islands spaced apart from each other; and conductive switches for selectively connecting adjacent islands together, thereby providing a desired length of said open stub.

4. A microwave amplifier comprising:

an amplifier;

an impedance match circuit for matching input and output impedances of said amplifier, said impedance matching circuit comprising input and output side distributed constant lines, each line having a length equivalent to ¼ wavelength of a signal having the highest frequency in a desired frequency band;

an open stub connected to at least one of said input and output side distributed constant lines, the length of said open stub being variable for varying a narrow frequency band in which maximum gain of said amplifier is attained; and a package including a lid and containing said amplifier and said impedance match circuit, said open stub comprising an insulating projection disposed on said lid inside said package, a metal sheet of a prescribed size disposed on said projection opposite said lid, said metal sheet contacting one of said distributed constant lines, thereby providing a desired length of said open stub according to the prescribed size of said metal sheet.

5. The microwave amplifier of claim 1 wherein said amplifier is a field effect transistor.

6. The microwave amplifier of claim 2 wherein said amplifier is a field effect transistor.

7. The microwave amplifier of claim 3 wherein said amplifier is a field effect transistor.

8. The microwave amplifier of claim 4 wherein said amplifier is a field effect transistor.

* * * * *

UNITED STATES PATENT AND TRADEMARK OFFICE
CERTIFICATE OF CORRECTION

PATENT NO. : 5,363,060
DATED : November 8, 1994
INVENTOR(S) : Masaki Kohno

It is certified that error appears in the above-indentified patent and that said Letters Patent is hereby corrected as shown below:

Column 8, line 29, change "match" to --matching-- (both occurances);

Column 8, line 31, change "match" to --matching--;

Column 8, line 52, change "put" to --input--;

Column 8, line 54, change "match" to --matching--;

Column 8, line 65, change "match" to --matching--;

Column 9, line 7, change "match" to --matching--;

Column 9, line 20, change "match" to --matching--;

Column 9, line 28, change "match" to --matching--;

Column 10, line 12, change "match" to --matching--;

Signed and Sealed this

Seventh Day of February, 1995

BRUCE LEHMAN

Attest:

*Attesting Officer*          *Commissioner of Patents and Trademarks*